United States Patent
Oh et al.

(10) Patent No.: US 11,747,847 B2
(45) Date of Patent: Sep. 5, 2023

(54) REGULATOR WITH MASTER/SLAVE VOLTAGE REGULATOR SCHEME

(71) Applicant: SK hynix Inc., Gyeonggi-do (KR)

(72) Inventors: Joo Won Oh, Gyeonggi-do (KR); Keun Jin Chang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 100 days.

(21) Appl. No.: 17/369,504

(22) Filed: Jul. 7, 2021

(65) Prior Publication Data
US 2022/0283599 A1    Sep. 8, 2022

(30) Foreign Application Priority Data

Mar. 3, 2021    (KR) .................. 10-2021-0028212

(51) Int. Cl.
| | | |
|---|---|---|
| *G05F 1/575* | (2006.01) | |
| *G05F 1/46* | (2006.01) | |
| *G11C 5/14* | (2006.01) | |
| *G11C 11/40* | (2006.01) | |

(52) U.S. Cl.
CPC .............. *G05F 1/575* (2013.01); *G05F 1/468* (2013.01); *G11C 5/147* (2013.01); *G11C 11/40* (2013.01)

(58) Field of Classification Search
CPC ......... G05F 1/575; G05F 1/468; G11C 5/147; G11C 11/40
See application file for complete search history.

(56) References Cited

U.S. PATENT DOCUMENTS

| | | | |
|---|---|---|---|
| 2017/0023958 A1* | 1/2017 | Dixit | G05F 1/56 |
| 2017/0185094 A1* | 6/2017 | Atkinson | G06F 1/263 |
| 2017/0255214 A1* | 9/2017 | Ho | H02M 3/158 |
| 2018/0173665 A1* | 6/2018 | Mishra | G06F 13/364 |
| 2018/0224887 A1* | 8/2018 | Pitigoi-Aron | H04L 12/40032 |
| 2019/0101969 A1* | 4/2019 | Gendler | G06F 1/324 |
| 2022/0059139 A1* | 2/2022 | Park | G11C 29/028 |

FOREIGN PATENT DOCUMENTS

| | | | | |
|---|---|---|---|---|
| DE | 102016117759 A1 * | 3/2017 | | G05F 1/56 |
| KR | 10-0748553 | 8/2007 | | |
| KR | 10-2018-0118131 | 10/2018 | | |
| KR | 20220101356 A * | 7/2022 | | |
| WO | WO-2017151303 A1 * | 9/2017 | | G05F 1/46 |

* cited by examiner

*Primary Examiner* — Sisay G Tiku
(74) *Attorney, Agent, or Firm* — IP & T GROUP LLP

(57) ABSTRACT

Disclosed is a regulator comprising a first voltage regulator suitable for generating a comparison voltage by comparing a reference voltage with a feedback voltage, and outputting a first voltage control signal and a second voltage control signal based on the comparison voltage; a plurality of second voltage regulators suitable for receiving the first voltage control signal and the second voltage control signal, generating a voltage based on the first voltage control signal and the second voltage control signal, and outputting the generated voltage; and a plurality of control signal transmitters suitable for receiving the first voltage control signal and the second voltage control signal from the first voltage regulator and transferring the received voltage control signals to the plurality of second voltage regulators.

22 Claims, 4 Drawing Sheets

REGULATOR WITH MASTER/SLAVE VOLTAGE REGULATOR SCHEME

CROSS-REFERENCE TO RELATED APPLICATION

This application claims priority under 35 U.S.C. § 119 to Korean Patent Application No. 10-2021-0028212 filed on Mar. 3, 2021, which is incorporated herein by reference in its entirety.

BACKGROUND

1. Field

Various embodiments of the present disclosure relate to a regulator, and more particularly, to a regulator which compares a reference voltage with a feedback voltage and regulates an output voltage according to a comparison result.

2. Discussion of the Related Art

Many portable electronics include a semiconductor memory. A semiconductor memory exhibits excellent stability and durability because it has no mechanical driving parts like hard disk drives (HDDs). Semiconductor memories also consume less power and have higher data access speeds than HDDs. Examples of storage devices equipped with a semiconductor memory include a universal serial bus (USB) memory device, a memory card having one or more interfaces, and a solid state drive (SSD).

SUMMARY

Various embodiments of the present disclosure are directed to a regulator which includes a master voltage regulator and a slave voltage regulator, wherein the master voltage regulator controls the slave voltage regulator to output a voltage equal or close to a voltage generated by the master voltage regulator.

Also, various embodiments of the present disclosure are directed to a regulator including a plurality of slave voltage regulators which are separately operated to reduce interference noise between the slave voltage regulators.

Additionally, various embodiments of the present disclosure are directed to a regulator which includes a master voltage regulator and a slave voltage regulator, wherein each of the master voltage regulator and the slave voltage regulator has a plurality of transistors coupled in series and applies control signals to the respective transistors to regulate the amount of current, thereby precisely regulating an output voltage.

Furthermore, various embodiments of the present disclosure are directed to a regulator which may reduce a loss of a voltage supplied from an external device through capacitors coupled to a plurality of transistors coupled in series.

In addition, various embodiments of the present disclosure are directed to a regulator which may quickly transfer a control signal to a slave voltage regulator through a fast charging switch attached to a control signal transmitter.

In an embodiment of the present disclosure, a regulator may include: a first voltage regulator suitable for generating a comparison voltage by comparing a reference voltage with a feedback voltage, and outputting a first voltage control signal and a second voltage control signal based on the comparison voltage; a plurality of second voltage regulators suitable for receiving the first voltage control signal and the second voltage control signal, generating a voltage based on the first voltage control signal and the second voltage control signal, and outputting the generated voltage; and a plurality of control signal transmitters suitable for receiving the first voltage control signal and the second voltage control signal from the first voltage regulator and transferring the received voltage control signals to the plurality of second voltage regulators.

In an embodiment of the present disclosure, a controller may include a host interface including: a receiver circuit suitable for receiving data from a host; a transmitter circuit suitable for transmitting data to the host; and a regulator suitable for supplying power to the receiver circuit and the transmitter circuit, wherein the regulator comprises: a first voltage regulator suitable for generating a comparison voltage by comparing a reference voltage with a feedback voltage, and outputting a first voltage control signal and a second voltage control signal based on the comparison voltage; a plurality of second voltage regulators suitable for receiving the first control signal and the second voltage control signal, generating a voltage based on the first control signal and the second voltage control signal, and outputting the generated voltage; and a control signal transmitter suitable for receiving the first control signal and the second voltage control signal from the first voltage regulator and transferring the received voltage control signals to the plurality of second voltage regulators.

In accordance with the present disclosure, a regulator circuit may include: a master voltage regulator configured to compare a reference voltage with an output voltage and output a first voltage control signal and a second voltage control signal based on the comparison result, the first voltage control signal having a voltage level greater than that of the second voltage control signal; a control signal transmitter configured to receive the first voltage control signal and the second voltage control signal and output the first voltage control signal and the second voltage control signal as a first control signal and a second control signal at a first speed or a third control signal and a fourth control signal at a second speed lower than the first speed; and one or more slave voltage regulators, each slave voltage regulator configured to receive the first control signal and the second control signal or the third control signal and the fourth control signal and generate an operation voltage having a voltage range adjusted based on the first control signal and the second control signal or the third control signal and the fourth control signal.

In accordance with embodiments of the present disclosure, the regulator may include the master voltage regulator and the slave voltage regulator, and the master voltage regulator may control the slave voltage regulator to output a voltage equal or close to a voltage generated by the master voltage regulator.

Furthermore, the regulator may include the plurality of slave voltage regulators which are separately operated to reduce interference noise between the slave voltage regulators.

Furthermore, the regulator may include the master voltage regulator and the slave voltage regulator, and each of the master voltage regulator and the slave voltage regulator may have the plurality of transistors coupled in series and apply control signals to the respective transistors to regulate the amount of current, thereby precisely regulating an output voltage.

Furthermore, the regulator can reduce a loss of a voltage supplied from the outside through capacitors coupled to the plurality of transistors coupled in series.

Furthermore, the regulator can quickly transfer the control signal to the slave voltage regulator through the fast charging switch attached to the control signal transmitter.

DETAILED DESCRIPTION

Hereafter, embodiments of the present disclosure will be described in detail with reference to the accompanying drawings. It should be understood that the following descriptions will be focused on portions required for understanding an operation in accordance with an embodiment, and descriptions of the other portions will be ruled out in order not to unnecessarily obscure subject matters of the present disclosure.

Figure 1:
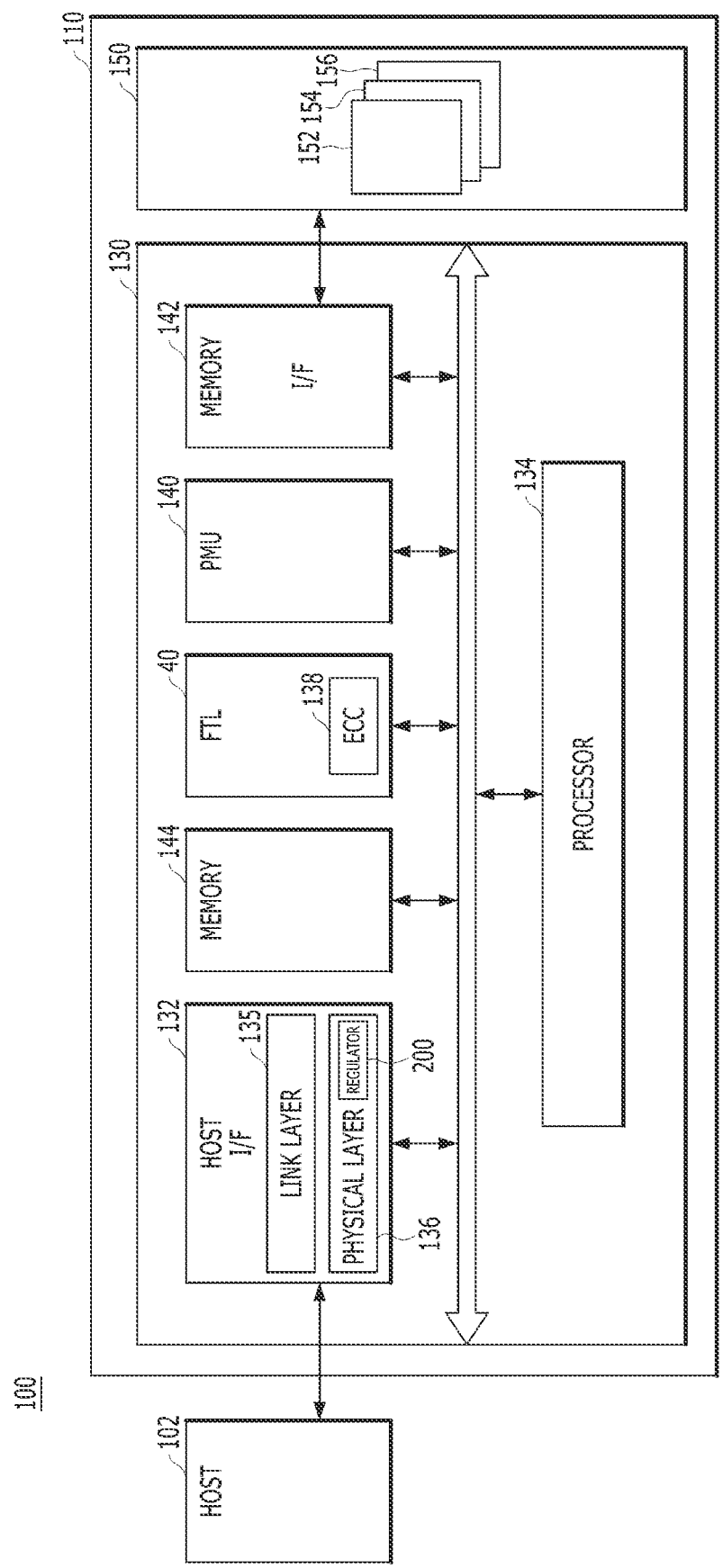
FIG. 1 is a diagram schematically illustrating an example of a data processing system including a memory system in accordance with an embodiment of the present disclosure.

FIG. 1 illustrates a data processing system 100, which may include a host 102 engaged or interlocked with a memory system 110, in accordance with an embodiment of the present disclosure.

The host 102 may include a portable electronic device (e.g., a mobile phone, an MP3 player, a laptop computer, etc.) or an electronic device such as a desktop computer, a game player, a television (TV), a projector and the like.

The host 102 may also include at least one operating system (OS) to manage and control functions and operations of the host 102. For example, the OS can provide interoperability between the host 102 engaged with the memory system 110 and a user of the memory system 110. The OS may support functions and operations corresponding to user requests.

By way of example but not limitation, the OS can be a general operating system or a mobile operating system, for example, according to mobility of the host 102. The general operating system may be, for example, a personal operating system or an enterprise operating system according to system requirements or a user environment. The personal operating system (e.g., Windows, Chrome, etc.) may be subject to support services for various purposes. The enterprise operating systems can be specialized for securing and supporting high performance, including Windows servers, Linux, Unix and the like.

The mobile operating system may be based on, for example, Android, iOS, Windows mobile, or another system. The mobile operating system may be subject to support services or functions for mobility (e.g., a power saving function). In one embodiment, the host 102 may include a plurality of operating systems, and may execute multiple operating systems interlocked with the memory system 110 based on a user request. The host 102 may transmit a plurality of commands corresponding to the user requests to the memory system 110, to thereby perform operations corresponding to commands within the memory system 110.

The memory system 110 may operate or perform a specific function or operation in response to a request from the host 102, e.g., may store data to be accessed by the host 102. The memory system 110 may be used as a main memory system or an auxiliary memory system of the host 102. The memory system 110 may be implemented with one of various types of storage devices electrically coupled with the host 102 and may communicate therewith according to a communication standard or protocol of a host interface. Non-limiting examples of a storage device include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device (e.g., a dynamic random access memory (DRAM) and a static RAM (SRAM)) and/or a nonvolatile memory device (e.g., a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), a flash memory, etc.).

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which, for example, may be in any of the types of memory systems as exemplified above. By way of example but not limitation, the controller 130 and the memory device 150 may be integrated into a single semiconductor device. The controller 130 and the memory device 150 may be integrated into an SSD for improving operation speed. When the memory system 110 is used as an SSD, the operating speed of the host 102 connected to the memory system 110 can be improved more than that of the host 102 implemented with a hard disk drive (HDD).

In addition, the controller 130 and the memory device 150 may be integrated into one semiconductor device to form a memory card, such as a PC card (PCMCIA), a compact flash card (CF), a memory card such as a smart media card (e.g., SM, SMC), a memory stick, a multimedia card (e.g., MMC, RS-MMC, MMCmicro), a secure digital (SD) card (e.g., SD, miniSD, microSD, SDHC), a universal flash memory or the like.

The memory system 110 may be configured as part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain the storage of data therein even when electrical power is not supplied. The memory device 150 may store data provided from the host 102 through a write operation and may provide data stored therein to the host 102 through a read operation. The memory device 150 may include a plurality of memory blocks 152, 154, 156, each of which may include a plurality of pages. Each of the pages may include a plurality of memory cells to which word lines (WL) are electrically coupled. The memory device 150 also includes a plurality of memory dies, each of which includes a plurality of planes and each of the planes including a plurality of memory blocks 152, 154, 156. The memory device 150 may be a non-volatile memory device. Examples of the non-volatile memory device include a flash memory having a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102. The controller 130 may store the data, provided by the host 102, to the memory device 150.

The controller 130 may include a host interface (I/F) 132, a processor 134, a flash translation layer (FTL) 40, a power management unit (PMU) 140, a memory interface (I/F) 142 and a memory 144, all operatively coupled via an internal bus.

The host interface 132 may process commands and data from the host 102 and may communicate with the host 102 through at least one of various communication standards or interface protocols. Examples of communication standards or interface protocols include a universal serial bus (USB), a multimedia card (MMC), a peripheral component interconnect-express (PCI-e or PCIe), a small computer system interface (SCSI), a serial-attached SCSI (SAS), a serial advanced technology attachment (SATA), a parallel advanced technology attachment (DATA), a small computer system interface (SCSI), an enhanced small disk interface (ESDI) and an integrated drive electronics (IDE). The host interface 132 may be driven through firmware referred to as a host interface layer (HIL). The host interface 132 may serve to exchange data with the host 102, and include a link layer 135 and a physical layer 136. The physical layer 136 may provide an electrical signal to the host 102, and receive an electrical signal from the host 102. In an embodiment, the physical layer 136 may support the mobile industry processor interface (MIPI) M-PHY protocol.

The link layer 135, which is an upper layer of the physical layer 136, may convert a message, which is to be transmitted to the host 102, into an electrical signal and provide the electrical signal to the physical layer 136. Furthermore, the link layer 135 may check whether an electrical signal inputted from the physical layer 136 is valid, and convert the electrical signal into a message. In an embodiment, the link layer 135 may support the MIPI UNIPRO protocol.

The physical layer 136 may include a receiver circuit (not illustrated) for receiving an electrical signal from the host 102, a transmitter circuit (not illustrated) for transmitting an electrical signal to the host 102, a phase control circuit (not illustrated) for controlling a phase supplied to the receiver circuit and the transmitter circuit, and a regulator 200 for supplying power to the receiver circuit, the transmitter circuit and the phase control circuit.

The regulator 200 may include a master voltage regulator and a plurality of slave voltage regulators. The master voltage regulator may compare a reference voltage supplied from the outside of the master voltage regulator to a voltage fed back from the inside of the master voltage regulator. Further, the master voltage regulator may generate a control signal for controlling a voltage which is generated by a slave voltage regulator, and transmit the control signal to the slave voltage regulator. The plurality of slave voltage regulators may supply power to the receiver circuit, the transmitter circuit and the phase control circuit in response to the receiver circuit, the transmitter circuit and the phase control circuit, respectively. The detailed configuration of the regulator 200 will be described below.

The FTL 40 may also include an error correction code (ECC) component 138, which may correct one or more error bits of data processed in the memory device 150 and which may include an ECC encoder and an ECC decoder. The ECC encoder may perform error correction encoding of data to be programmed in the memory device 150, in order to generate encoded data into which one or more parity bits are added. The encoded data may be stored by the ECC encoder in memory device 150. The ECC decoder may detect and correct errors in data read from the memory device 150 when the controller 130 reads data stored in the memory device 150. For example, after performing error correction decoding on the data read from the memory device 150, the ECC component 138 may determine whether the error correction decoding has succeeded and output an instruction signal (e.g., a correction success signal or a correction fail signal).

The ECC component 138 may use the parity bit, generated during the ECC encoding process, to correct the error bit(s) of the read data. When the number of error bits is greater than or equal to a threshold number of correctable error bits, the ECC component 138 might not correct error bits but instead may output an error correction fail signal indicating failure in correcting the error bits.

The ECC component 138 may perform an error correction operation using any of various codes. Examples of codes include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), and a Block coded modulation (BCM), as well as others. The ECC component 138 may also include various circuits, modules, systems or devices for performing error correction operation based on at least one of the codes.

In the illustrated embodiment of FIG. 1, the FTL 40 includes the ECC component 138. In another embodiment, the ECC component 138 may be implemented as a separate module, circuit, firmware, instructions, or the like in the controller 130.

The PMU 140 may manage electrical power of the controller 130.

The memory interface 142 may serve as an interface for handling commands and data transferred between the controller 130 and the memory device 150, in order to allow the controller 130 to control the memory device 150 in response to a request from the host 102. The memory interface 142 may generate a control signal for the memory device 150 and may process data entered into or outputted from the memory device 150 under the control of the processor 134 when the memory device 150 is a flash memory, including but not limited to a NAND flash memory. The memory interface 142 may serve an interface for handling commands and data between the controller 130 and the memory device 150. For example, the memory interface 142 may serve as a NAND flash interface for purposes of handling operations between the controller 130 and the memory device 150. In an embodiment, the memory interface 142 may be implemented through firmware (e.g., a flash interface layer (FIL)), which serves as a component to exchange data with memory device 150.

The memory 144 may support operations performed by the memory system 110 and the controller 130. The memory 144 may store temporary or transactional data relating to or delivered for operations in the memory system 110 and the controller 130. The controller 130 may control the memory device 150 in response to a request from the host 102. The controller 130 may deliver data read from the memory device 150 to the host 102. The controller 130 may store data entered through the host 102 within the memory device 150. The memory 144 may be used to store data for the controller 130 and the memory device 150 to perform operations such as read operations or program/write operations.

The memory 144 may be implemented with a volatile memory, e.g., a static random access memory (SRAM), a dynamic random access memory (DRAM), or both. In the illustrated embodiment of FIG. 2, the memory 144 is disposed within the controller 130. In another embodiment, the memory 144 may be external and coupled to the controller 130. For instance, the memory 144 may be embodied as an external volatile memory having a memory interface that transfers data and/or signals between the memory 144 and the controller 130.

The memory 144 may store data for performing operations such as data writing and data reading requested by the host 102, and/or data transfer between the memory device 150 and the controller 130 for background operations such as garbage collection and wear levelling. In accordance with an embodiment, to support operations in the memory system 110, the memory 144 may include one or more of a program memory, a data memory, a write buffer/cache, a read buffer/cache, a data buffer/cache, a map buffer/cache, or the like.

The processor 134 may be implemented, for example, with a microprocessor or a central processing unit (CPU). In one embodiment, the memory system 110 may include one or more processors 134. The processor 134 may control overall operation of the memory system 110. By way of example but not limitation, the processor 134 may control a program operation or a read operation of the memory device 150, in response to a write request or a read request entered from the host 102. In accordance with an embodiment, the processor 134 may use or execute instructions (e.g., firmware) to control overall operation of the memory system 110. In one embodiment, firmware may refer to a flash translation layer (FTL). The FTL may operate as an interface between the host 102 and the memory device 150. The host 102 may transmit requests for write and read operations to the memory device 150 through the FTL.

For example, the controller 130 may use the processor 134 (e.g., implemented as a microprocessor or central processing unit (CPU)) to perform operations requested from the host 102 in the memory device 150. The processor 134 may engage with the memory device 150 to handle instructions or commands corresponding to commands from the host 102. For example, the controller 130 may perform a foreground operation as a command operation corresponding to a command from the host 102. Examples of the command include a program operation corresponding to a write command, a read operation corresponding to a read command, an erase/discard operation corresponding to an erase/discard command, and a parameter set operation corresponding to a set parameter command or a set feature command with a set command.

In one embodiment, the controller 130 may perform a background operation on the memory device 150 through the processor 134. By way of example but not limitation, the background operation for the memory device 150 includes an operation of copying and storing data stored in a memory block (among memory blocks 152, 154, 156 in the memory device 150) to another memory block, e.g., a garbage collection (GC) operation. The background operation may include an operation of moving or swapping data stored in at least one of the memory blocks 152, 154, 156 to at least another one of the memory blocks 152, 154, 156, e.g., a wear leveling (WL) operation.

During a background operation, the controller 130 may use the processor 134 to store the map data (stored in the controller 130) to at least one of the memory blocks 152, 154, 156 in the memory device 150, e.g., a map flush operation. A bad block management operation of checking or searching for bad blocks among the memory blocks 152, 154, 156 is another example of a background operation that may be performed by the processor 134.

In the memory system 110, the controller 130 may perform a plurality of command operations corresponding to commands entered from the host 102. For example, when performing program operations corresponding to program commands, read operations corresponding to read commands and erase operations corresponding to erase commands sequentially, randomly or alternatively, the controller 130 may determine which channel(s) or way(s) is/are proper or appropriate for performing each operation. The channel(s) or way(s) may be ones that connect, for example, the controller 130 to a plurality of memory dies in the memory 150.

The controller 130 may transmit data or instructions via determined channels or ways for performing each operation. The memory dies in the memory 150 may transmit operation results, via the same channels or ways, after respective operations are completed. Then, the controller 130 may transmit a response or an acknowledge signal to the host 102. In an embodiment, the controller 130 may check a status of each channel or each way. In response to a command from the host 102, the controller 130 may select at least one channel or way based on the status of each channel or way, so that instructions and/or operation results with data may be delivered via the selected channel(s) or way(s).

By way of example but not limitation, the controller 130 may recognize statuses regarding channels (or ways) associated with memory dies in the memory device 150. For example, the controller 130 may determine the state of each channel or each way as a busy state, a ready state, an active state, an idle state, a normal state or an abnormal state, or various combinations thereof. The determination of which channel or way an instruction (and/or a data) is delivered through by the controller 130 may be associated with a physical block address, e.g., to which die(s) the instruction (and/or the data) is delivered.

In one embodiment, the controller 130 may refer to descriptors delivered from the memory device 150. The descriptors may include, for example, a block or page of one or more parameters that describe a feature relating to the memory device 150 storing data having a predetermined format or structure. The descriptors may include, for example, device descriptors, configuration descriptors, unit descriptors, or another type of descriptor. The controller 130 may refer to, or use, the descriptors to determine which channel(s) or way(s) an instruction or a data is exchanged via.

Figure 2:
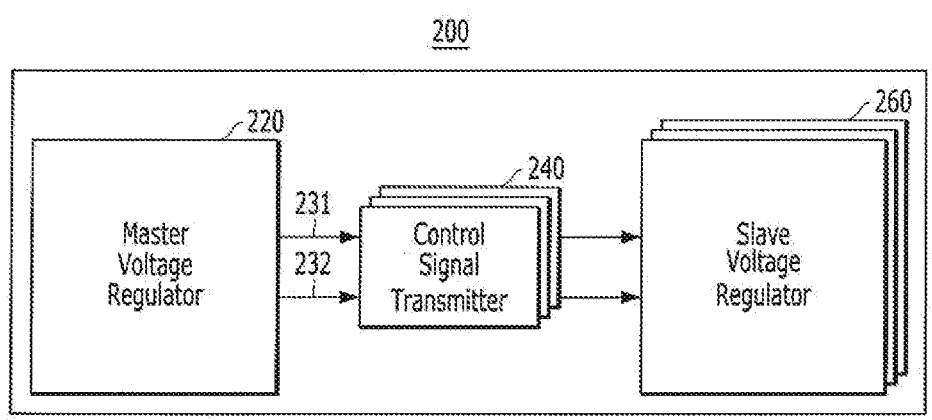
FIG. 2 is a diagram illustrating a configuration of a regulator in accordance with an embodiment of the present disclosure.

FIG. 2 is a diagram illustrating a configuration of a regulator 200 in accordance with an embodiment of the present disclosure. Referring to FIG. 2, the regulator 200 may include a master voltage regulator 220, a control signal transmitter 240 and a slave voltage regulator 260. FIG. 2 illustrates that the regulator 200 may include a plurality of control signal transmitters 240 and a plurality of slave voltage regulators 260, which are coupled to one master voltage regulator 220. However, the regulator 200 may include one master voltage regulator 220, one control signal transmitter 240 and one slave voltage regulator 260. That is, the numbers of the control signal transmitters 240 and the slave voltage regulators 260, which are included in the regulator 200, may each correspond to the number of circuits that receive power.

The master voltage regulator 220 may generate a control signal for controlling the slave voltage regulator 260 to generate and output a voltage, and transfer the control signal to the control signal transmitter 240.

The master voltage regulator 220 may compare a reference voltage supplied from the outside of the master voltage regulator 220 to a voltage fed back from the inside of the master voltage regulator 220. Further, the master voltage regulator 220 may generate control signals 231 and 232 for controlling the voltage which is generated by the slave voltage regulator 260, and transfer the control signals 231 and 232 to the control signal transmitter 240.

The control signals 231 and 232 may indicate signals for controlling the magnitude of the voltage generated by the slave voltage regulator 260. The slave voltage regulator 260 may receive the control signals 231 and 232, generate a voltage corresponding to the control signals 231 and 232, and transfer the generated voltage to each circuit of the host interface 132.

Specifically, when the reference voltage is higher than the feedback voltage, the master voltage regulator 220 may regulate the control signals 231 and 232 to increase the voltage outputted from the slave voltage regulator 260. Furthermore, when the reference voltage is lower than the feedback voltage, the master voltage regulator 220 may regulate the control signals 231 and 232 to decrease the voltage outputted from the slave voltage regulator 260. The control signals 231 and 232 are voltages to be applied to the slave voltage regulator 260. When the reference voltage is higher than the feedback voltage, the master voltage regulator 220 may raise the voltage levels of the control signals 231 and 232 and output the control signals 231 and 232. On the other hand, when the reference voltage is lower than the feedback voltage, the master voltage regulator 220 may lower the voltage levels of the control signals 231 and 232 and output the control signals 231 and 232.

The control signal transmitter 240 may be located between the master voltage regulator 220 and the slave voltage regulator 260. The control signal transmitter 240 may receive the control signals 231 and 232 from the master voltage regulator 220 and transfer the received control signals 231 and 232 to the slave voltage regulator 260. The control signal transmitter 240 may transfer the control signals 231 and 232 to the slave voltage regulator 260 in a normal mode or fast mode. When operating in the fast mode, the control signal transmitter 240 may transfer the control signals 231 and 232, received from the master voltage regulator 220, to the slave voltage regulator 260 faster than in the normal mode.

The slave voltage regulator 260 may receive the control signals 231 and 232 from the control signal transmitter 240. The slave voltage regulator 260 may generate a voltage having a magnitude corresponding to the control signals 231 and 232, and transfer the generated voltage to each circuit of the host interface 120.

The master voltage regulator 220 and the slave voltage regulator 260 may be configured to have the same structure or a similar structure. The master voltage regulator 220 may generate a voltage equal or close to a voltage which is to be outputted by the slave voltage regulator 260, and the generated voltage may be compared as the feedback voltage to the reference voltage.

That is, the slave voltage regulator 260 may generate a voltage equal or close to the feedback voltage generated by the master voltage regulator 220 according to the control signals 231 and 232 transmitted by the master voltage regulator 220.

Figure 3:
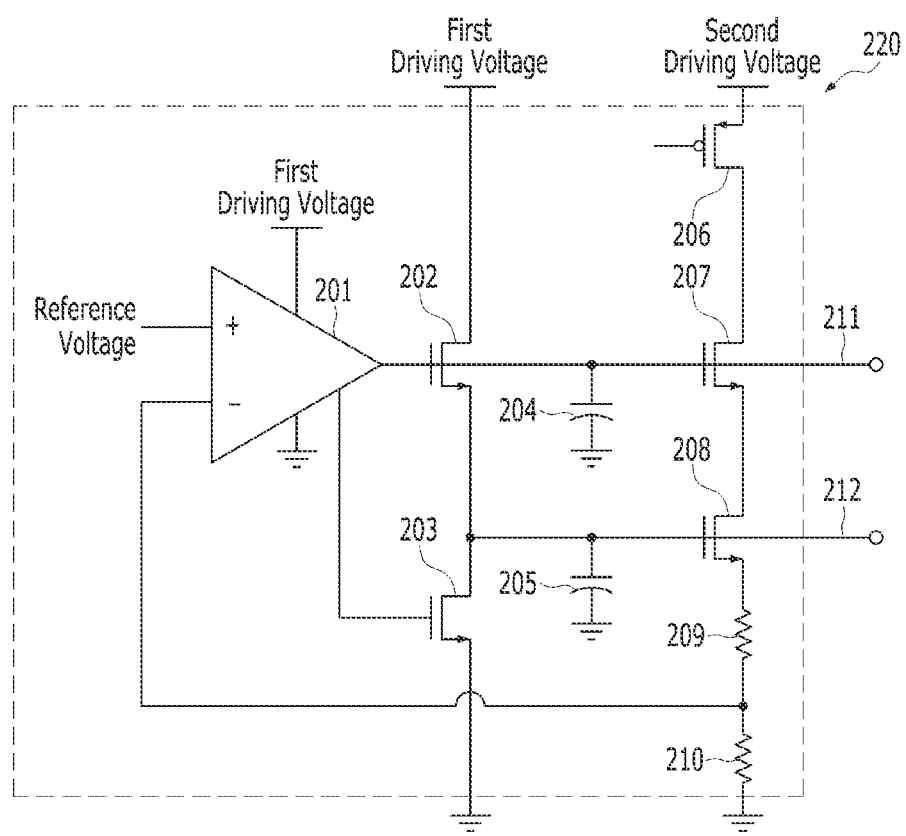
FIG. 3 is a diagram illustrating a master voltage regulator in accordance with an embodiment of the present disclosure.

FIG. 3 is a diagram illustrating a master voltage regulator in accordance with an embodiment of the present disclosure, e.g., the master voltage regulator 220 of FIG. 2 in detail. Referring to FIG. 3, the master voltage regulator 220 may include a comparator 201, a control transistor 202, a ground coupling transistor 203, a first master transistor 207, a second master transistor 208 coupled in series to the first master transistor 207, a master driving transistor 206, a first master capacitor 204, a second master capacitor 205, a first resistor 209 and a second resistor 210.

The comparator 201 may be configured as an operational amplifier (OP-AMP). The comparator 201 may be driven by receiving a first driving voltage and a ground voltage. The comparator 201 may have a positive (+) terminal (i.e., a non-inverting terminal) to which the reference voltage is inputted and a negative (−) terminal (i.e., an inverting terminal) to which the voltage between the first and second resistors 209 and 210 is inputted as the feedback voltage.

An output of the comparator 201 may be coupled to a gate of the control transistor 202, a gate of the first master transistor 207 and one end of the first master capacitor 204. The other end of the first master capacitor 204 may be coupled to the ground.

A drain of the control transistor 202 may be configured to receive the first driving voltage, and a source of the control transistor 202 may be coupled to a drain of the ground coupling transistor 203.

The source of the control transistor 202 and the drain of the ground coupling transistor 203 may be coupled to a gate of the second master transistor 208. One end of the second master capacitor 205 may be coupled to the source of the control transistor 202, the drain of the ground coupling transistor 203, and the gate of the second master transistor 208. The other end of the second master capacitor 205 may be coupled to the ground. A source of the ground coupling transistor 203 may be coupled to the ground. The ground coupling transistor 203 may be turned all the time and may be operated as a current source.

In the illustrated example of FIG. 3, the control transistor 202 and the ground coupling transistor 203 may be implemented with NMOS transistors. However, the control transistor 202 and the ground coupling transistor 203 may be implemented with PMOS transistors, or a combination of an NMOS transistor and a PMOS transistor.

A second driving voltage may be applied to a source of the master driving transistor 206. A drain of the master driving transistor 206 may be coupled to a drain of the first master transistor 207. A source of the first master transistor 207 may be coupled to a drain of the second master transistor 208. The first and second master transistors 207 and 208 may be coupled in series to reduce the power supply rejection ratio (PSRR) at which an external voltage transferred from the second driving voltage is attenuated.

The master driving transistor 206 may allow a current or no current to flow into the first and second master transistors 207 and 208.

That is, when a set voltage (e.g., a negative voltage) applied to the gate of the master driving transistor 206, the master driving transistor 206 is turned on to pass a current through the first and second master transistors 207 and 208 coupled to the master driving transistor 206, and a divided voltage is generated between the first and second resistors 209 and 210.

On the other hand, when a set voltage (e.g., a voltage of 0V or more) is applied to the gate of the master driving transistor 206, the master driving transistor 206 is turned off, and no current flows through the first and second master transistors 207 and 208 coupled to the master driving transistor 206.

Furthermore, a source of the second master transistor 208 may be coupled to one end of the first resistor 209. The other end of the first resistor 209 is coupled in series to one end of the second resistor 210. The other end of the second resistor 210 is coupled to the ground. The voltage generated between the first and second resistors 209 and 210 may be fed back to the negative terminal of the comparator 201, and compared to the reference voltage.

In order to describe the operation of the master voltage regulator 220, the reference voltage, the first driving voltage and the second driving voltage are exemplified as 0.75V, 2V and 1.2V, respectively. At this time, the master driving transistor 206 has been turned on, that is, a negative voltage has been applied to the gate thereof.

When the voltage fed back to the negative terminal of the comparator 201 is lower than the reference voltage of 0.75V, a voltage close to the first driving voltage of 2V is outputted from the comparator 201, and applied to the gates of the control transistor 202 and the ground coupling transistor 203.

Then, the control transistor 202 and the ground coupling transistor 203 are turned on, and a current is stored in the first and second master capacitors 204 and 205.

When the current is stored in the first master capacitor 204 such that the voltage of the first master capacitor 204 reaches a voltage enough to drive the first master transistor 207, the first master transistor 207 is turned on. Similarly, when the current is stored in the second master capacitor 205 such that the voltage of the second master capacitor 205 reaches a voltage enough to drive the second master transistor 208, the second master transistor 208 is turned on. Therefore, as a current flows through the first and second resistors 209 and 210, a divided voltage is generated between the first and second resistors 209 and 210. The divided voltage is fed back to the negative terminal of the comparator 201, and compared to the reference voltage.

Furthermore, the first and second master capacitors 204 and 205 coupled to the gates of the first and second master transistors 207 and 208 may reduce the PSRR at which an external voltage is attenuated. Thus, the voltage may be stably supplied to the gates of the first and second master transistors 207 and 208.

As the reference voltage is higher than the voltage fed back to the negative terminal of the comparator 201, the voltage outputted from the comparator 201 becomes closer to the first driving voltage, and a higher voltage is applied to the first and second master transistors 207 and 208. As a result, a larger amount of current flows through the first and second resistors 209 and 210, thereby raising the voltage which is generated between the first and second resistors 209 and 210 and fed back to the negative terminal of the comparator 201, i.e., the voltage outputted from the slave voltage regulator 260.

When the voltage fed back to the negative terminal of the comparator 201 is higher than the reference voltage of 0.75V, the voltage outputted from the comparator 201 is lowered, and the lowered voltage is applied to the gates of the control transistor 202 and the ground coupling transistor 203.

In this case, since the lowered voltage is applied to the first and second master transistors 207 and 208, the amount of current flowing through the first and second master transistors 207 and 208 decreases. Also, the voltage which is generated between the first and second resistors 209 and 210 and fed back to the negative terminal of the comparator 201, i.e., the voltage outputted from the slave voltage regulator 260 is lowered.

The master voltage regulator 220 may transfer the voltage applied to the gate of the first master transistor 207 and the voltage applied to the gate of the second master transistor 208 as the control signals 231 and 232 to the control signal transmitter 240. Further, the control signals 231 and 232 may be used to control the slave voltage regulator 260 to regulate the output voltage.

Figure 4:
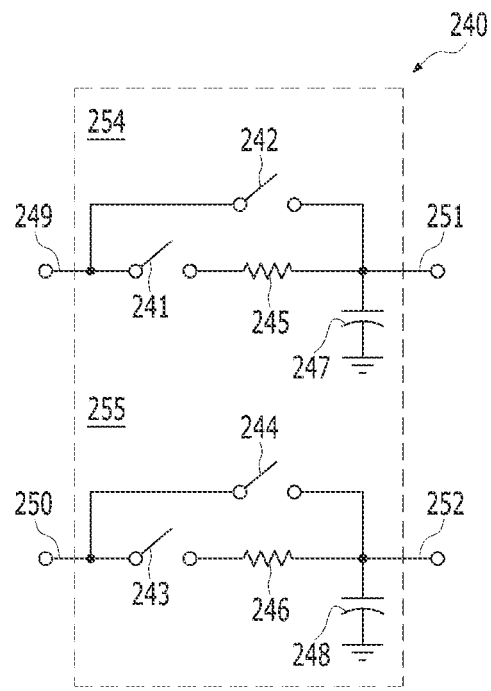
FIG. 4 is a diagram illustrating a control signal transmitter in accordance with an embodiment of the present disclosure.

FIG. 4 is a diagram illustrating a control signal transmitter in accordance with an embodiment of the present disclosure, e.g., the control signal transmitter 240 of FIG. 2 in detail. Referring to FIG. 4, the control signal transmitter 240 includes a first control signal transmitter 254 and a second control signal transmitter 255. The first and second control signal transmitters 254 and 255 include control signal input terminals 249 and 250, control signal output terminals 251 and 252, fast charging switches 242 and 244, operation switches 241 and 243, resistors 245 and 246 and capacitors 247 and 248, respectively.

The control signal input terminals 249 and 250 may be coupled to the first master control signal output terminal 211 and the second master control signal output terminal 212 of the master voltage regulator 220, respectively. Specifically, the first control signal input terminal 249 of the first control signal transmitter 254 may be coupled to the first master control signal output terminal 211 of the master voltage regulator 220. The second control signal input terminal 250 of the second control signal transmitter 255 may be coupled to the second master control signal output terminal 212 of the master voltage regulator 220.

The first and second control signal output terminals 251 and 252 of the first and second control signal transmitters 254 and 255 may be coupled to control signal input terminals of the slave voltage regulator 260. Specifically, the first control signal output terminal 251 of the first control signal transmitter 254 may be coupled to a first control signal input terminal of the slave voltage regulator 260. The second control signal output terminal 252 of the second control signal transmitter 255 may be coupled to a second control signal input terminal of the slave voltage regulator 260.

The operation switches 241 and 243 of the first and second control signal transmitters 254 and 255 may be coupled in series to the resistors 245 and 246, respectively. The fast charging switches 242 and 244 may be coupled in parallel to the operation switches 241 and 243 and the resistors 245 and 246, respectively. The operation switches 241 and 243, the resistors 245 and 246 and the fast charging switches 242 and 244, which are respectively coupled in parallel, may each have one end coupled to the control signal output terminal of the master voltage regulator 220 and the other end coupled to the control signal input terminal of the slave voltage regulator 260. One ends of the capacitors 247 and 248 may be coupled to the fast charging switches 242 and 244, the operation switches 241 and 243 and the resistors 245 and 246, which are respectively coupled in parallel to the control signal input terminal of the slave voltage regulator 260. The other ends thereof may be coupled to the ground.

When the control signals are applied to the control signal input terminals 249 and 250 of the control signal transmitter 240 through the master control signal output terminals 211 and 212 of the master voltage regulator 220 while the fast charging switches 242 and 244 of the control signal transmitter 240 are in an off-state and the operation switches 241 and 243 are in an on-state, the control signals may be applied to the resistors 245 and 246 through the operation switches 241 and 243 to charge the capacitors 247 and 248. The voltages stored in the capacitors 247 and 248 may be transferred to the slave voltage regulator 260 through the control signal output terminals 251 and 252. As in the case of the master voltage regulator 220, the capacitors 247 and 248 may be charged with a specific voltage or more, which can turn on a transistor coupled to the control signal input terminal of the slave voltage regulator 260.

The control signal transmitter 240 may change the fast charging switches 242 and 244 to the on-state, and change the operation switches 241 and 243 to the off-state, such that the control signals can be transferred to the slave voltage regulator 260 faster than when the operation switches 241 and 243 are in the on-state. That is, when the fast charging switches 242 and 244 are in the on-state and the operation switches 241 and 243 are in the off-state, the control signals do not pass through the resistors 245 and 246, and thus the capacitors 247 and 248 can be fast charged. Therefore, the voltages of the capacitors 247 and 248 may reach the voltage, which is to be transferred to the slave voltage regulator 260, faster.

Furthermore, like the master voltage regulator 220, the capacitors 247 and 248 may reduce the PSRR at which an external voltage is attenuated, such that the voltage can be stably supplied to the slave voltage regulator 260.

The control signal transmitter 240 may transfer two control signals to the slave voltage regulator 260 such that the slave voltage regulator 260 can perform precise voltage control. That is, the control signal transmitter 240 may transfer the control signal having a voltage in a high range to the slave voltage regulator 260 through the first control signal output terminal 251, and the control signal having a voltage in a lower range than the control signal, applied to the first control signal output terminal 251, to the slave voltage regulator 260 through the second control signal output terminal 252. The slave voltage regulator 260 may regulate the voltage, which is finally outputted from the slave voltage regulator 260, through the two control signals having different ranges, such that the voltage becomes equal or close to the voltage generated by the master voltage regulator 220.

Figure 5:
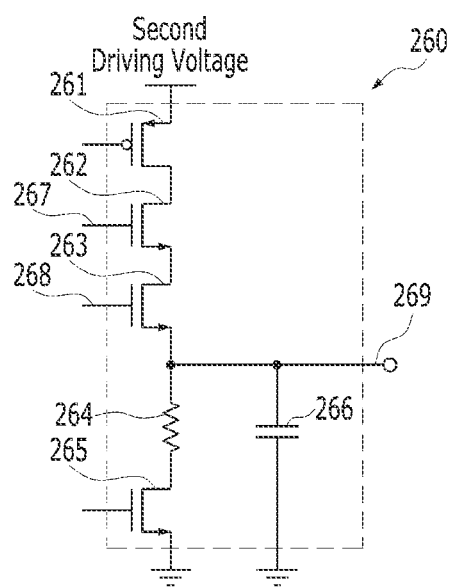
FIG. 5 is a diagram illustrating a slave voltage regulator in accordance with an embodiment of the present disclosure.

FIG. 5 is a diagram illustrating a slave voltage regulator in accordance with an embodiment of the present disclosure, e.g., the slave voltage regulator 260 of FIG. 2 in detail. Referring to FIG. 5, the slave voltage regulator 260 includes a slave driving transistor 261, a first slave transistor 262, a second slave transistor 263, an output resistor 264, a voltage division transistor 265 and an output capacitor 266.

A source of the slave driving transistor 261 may receive the second driving voltage, and a drain of the slave driving transistor 261 may be coupled to a drain of the first slave transistor 262. Furthermore, a source of the first slave transistor 262 may be coupled to a drain of the second slave transistor 263, and the drain of the second slave transistor 263 may be coupled to one end of the output resistor 264 and one end of the output capacitor 266. The other end of the output capacitor 266 may be coupled to the ground, and the output capacitor 266 may output an output voltage through an output voltage terminal 269. Furthermore, the other end of the output resistor 264 may be coupled to a drain of the voltage division transistor 265, and a source of the voltage division transistor 265 may be coupled to the ground.

A gate of the first slave transistor 262 may be coupled to the first control signal transmitter 254 through a first slave control signal input terminal 267 corresponding to the first control signal output terminal 251 of the first control signal transmitter 254. A gate of the second slave transistor 263 may be coupled to the second control signal transmitter 255 through a second slave control signal input terminal 268 corresponding to the second control signal output terminal 252 of the second control signal transmitter 255.

The control signal transferred from the first control signal transmitter 254 and the control signal transferred from the second control signal transmitter 255 are applied to the gate of the first slave transistor 262 and the gate of the second slave transistor 263, respectively. At this time, the control signal having a voltage in a high range may be applied to the gate of the first slave transistor 262, and the control signal having a voltage in a lower range than the control signal applied to the gate of the first slave transistor 262 may be applied to the gate of the second slave transistor 263.

When a voltage is applied to the gate of the first slave transistor 262, the amount of current flowing through the first slave transistor 262 may increase to a predetermined range of the applied voltage. Furthermore, when a voltage is applied to the gate of the second slave transistor 263, the amount of current flowing through the second slave transistor 263 may increase to a predetermined range of the applied voltage. The slave voltage regulator 260 may receive the control signals in different voltage ranges from the first and second control signal transmitters 254 and 255, respectively. Further, the slave voltage regulator 260 may differently control the voltages applied to the gates of the first and second slave transistors 262 and 263, thereby regulating the amount of current flowing through the output resistor 264 of the slave voltage regulator 260 and regulating the voltage outputted to the output voltage terminal 269.

In order to maintain the turn-on state of the voltage division transistor 265, a voltage to turn on the voltage division transistor 265 may be always applied to the gate of the voltage division transistor 265. When a high voltage is applied to the gate of the voltage division transistor 265, a large amount of current flows through the output resistor 264 such that a high voltage is outputted through the output voltage terminal 269. When the voltage division transistor 265 is not turned on, the voltage division transistor 265 may be floated so that a high voltage is outputted through the output voltage terminal 269. Thus, a voltage through which the sum of a voltage formed across the output resistor 264 by the current flowing through the second slave transistor 263 and a voltage between the drain and source of the voltage division transistor 265 becomes a predetermined value may be applied to the gate of the voltage division transistor 265. For example, the predetermined value may be 0.8V.

The first and second slave transistors 262 and 263 of the slave voltage regulator 260 may be configured in the same manner as the first and second master transistors 207 and 208 of the master voltage regulator 220. Further, the voltages applied to the gates of the first and second master transistors 207 and 208 may be transferred as the control signals to the slave voltage regulator 260. Thus, the slave voltage regulator 260 outputs a voltage equal or close to the voltage generated between the first and second resistors 209 and 210 of the second master transistor 208 of the master voltage regulator 220.

The slave driving transistor 261 of the slave voltage regulator 260 may be configured as a PMOS transistor. When a negative voltage is applied to the PMOS transistor, the slave driving transistor 261 is driven. When a voltage of 0V or more is applied to the PMOS transistor, the slave driving transistor 261 is not driven, and thus no current flows through the first and second slave transistors 262 and 263. As a result, the slave voltage regulator 260 does not operate.

In an embodiment, the master voltage regulator 220 and the slave voltage regulator 260 may be configured so that the master voltage regulator 220 may control the slave voltage regulator 260 to output a voltage equal or close to the voltage generated by the master voltage regulator 220.

Furthermore, the plurality of slave voltage regulators 260 may operate separately from one another, thereby reducing interference noise between the slave voltage regulators 260.

Furthermore, in each of the master voltage regulator 220 and the slave voltage regulator 260, the plurality of transistors may be coupled in series, and the control signals may be applied to the respective transistors to regulate the amount of current, which makes it possible to precisely regulate the output voltage.

Furthermore, the capacitors may be coupled to the plurality of transistors coupled in series, respectively, and reduce a loss of voltage supplied from the outside.

Furthermore, the fast charging switches may be attached to the control signal transmitters to transfer the control signals to the slave voltage regulators.

Although various embodiments have been described for illustrative purposes, it will be apparent to those skilled in the art that various changes and modifications may be made without departing from the spirit and scope of the invention as defined in the following claims. Furthermore, the embodiments may be combined to form additional embodiments.

What is claimed is:

1. A regulator comprising:
a first voltage regulator suitable for generating a comparison voltage by comparing a reference voltage with a feedback voltage, and outputting a first voltage control signal and a second voltage control signal based on the comparison voltage;
a plurality of second voltage regulators, each suitable for receiving the first voltage control signal and the second voltage control signal, generating a voltage based on the first voltage control signal and the second voltage control signal, and outputting the generated voltage; and
a plurality of control signal transmitters suitable for receiving the first voltage control signal and the second voltage control signal from the first voltage regulator and transferring the received voltage control signals to each of the plurality of second voltage regulators.

2. The regulator of claim 1, wherein the control signal transmitter comprises a first control signal transmitter suitable for receiving the first voltage control signal and a second control signal transmitter suitable for receiving the second voltage control signal,
wherein each of the first control signal transmitter and second control signal transmitter comprises an operation switch, a resistor coupled in series to the operation switch, a fast charging switch coupled in parallel to the operation switch and the resistor, and a capacitor.

3. The regulator of claim 2, wherein the first voltage control signal and the second voltage control signal do not pass through the resistor, but charge the capacitor, when the fast charging switch is in an on-state and the operation switch is in an off-state, and pass through the resistor and charge the capacitor, when the fast charging switch is in an off-state and the operation switch is in an on-state.

4. The regulator of claim 1, wherein the first voltage regulator comprises: a first master transistor suitable for regulating a current applied from a power supply based on the comparison voltage; and a second master transistor coupled in series to the first master transistor and suitable for secondarily regulating the current regulated by the first master transistor based on the comparison voltage.

5. The regulator of claim 4, wherein the first voltage regulator further comprises a plurality of capacitors coupled to each of the first master transistor and the second master transistor.

6. The regulator of claim 5, wherein the first voltage regulator further comprises a driving transistor suitable for controlling operations of the first master transistor and the second master transistor.

7. The regulator of claim 6, wherein the first voltage regulator further comprises:
a comparator suitable for comparing the reference voltage with the feedback voltage; and a voltage division resistor coupled to the second master transistor and suitable for receiving the current regulated by the second master transistor, and feeding a voltage, generated through the received current, as the feedback voltage back to the comparator.

8. The regulator of claim 7, wherein the comparator controls a control transistor to increase the current regulated flowing through the first master transistor and the second master transistor, when the reference voltage is higher than the feedback voltage, and controls the control transistor to decrease the current regulated flowing through the first master transistor and the second master transistor when the reference voltage is lower than the feedback voltage.

9. The regulator of claim 1, wherein each of the plurality of second voltage regulators comprises: a first slave transistor suitable for regulating a current applied from a power supply based on the first voltage control signal; and a second slave transistor coupled in series to the first slave transistor and suitable for secondarily regulating the current regulated by the first slave transistor based on the second voltage control signal.

10. The regulator of claim 9, wherein the second voltage regulator further comprises a driving transistor suitable for controlling operations of the first slave transistor and the second slave transistor.

11. A controller comprising:
a host interface including:
a receiver circuit suitable for receiving data from a host;
a transmitter circuit suitable for transmitting data to the host; and a regulator suitable for supplying power to the receiver circuit and the transmitter circuit, wherein the regulator comprises:

a first voltage regulator suitable for generating a comparison voltage by comparing a reference voltage with a feedback voltage, and outputting a first voltage control signal and a second voltage control signal based on the comparison voltage;

a plurality of second voltage regulators, each suitable for receiving the first voltage control signal and the second voltage control signal, generating a voltage based on the first voltage control signal and the second voltage control signal, and outputting the generated voltage; and a control signal transmitter suitable for receiving the first voltage control signal and the second voltage control signal from the first voltage regulator and transferring the received voltage control signals to each of the plurality of second voltage regulators.

12. The controller of claim 11, wherein the control signal transmitter comprises a first control signal transmitter suitable for receiving the first voltage control signal and a second control signal transmitter suitable for receiving the second voltage control signal, wherein each of the first control signal transmitter and the second control signal transmitter comprises an operation switch, a resistor coupled in series to the operation switch, a fast charging switch coupled in parallel to the operation switch and the resistor, and a capacitor.

13. The controller of claim 12, wherein the first voltage control signal and the second voltage control signal do not pass through the resistor, but charge the capacitor, when the fast charging switch is in an on-state and the operation switch is in an off-state, and pass through the resistor and charge the capacitor, when the fast charging switch is in an off-state and the operation switch is in an on-state.

14. The controller of claim 11, wherein the first voltage regulator comprises: a first master transistor suitable for regulating a current applied from a power supply based on the comparison voltage; and a second master transistor coupled in series to the first master transistor and suitable for secondarily regulating the current regulated by the first master transistor, based on the comparison voltage.

15. The controller of claim 14, wherein the first voltage regulator further comprises a plurality of capacitors coupled to each of the first master transistor and the second master transistor.

16. The controller of claim 15, wherein the first voltage regulator further comprises a driving transistor suitable for controlling operations of the first master transistor and the second master transistor.

17. The controller of claim 16, wherein the first voltage regulator further comprises: a comparator suitable for comparing the reference voltage with the feedback voltage; and a voltage division resistor coupled to the second master transistor, and suitable for receiving the current regulated by the second master transistor, and feeding a voltage, generated through the received current, as the feedback voltage back to the comparator.

18. The controller of claim 17, wherein the comparator controls a control transistor to increase the current regulated flowing through the first master transistor and the second master transistor, when the reference voltage is higher than the feedback voltage, and controls the control transistor to decrease the current regulated flowing through the first master transistor and the second master transistor when the reference voltage is lower than the feedback voltage.

19. The controller of claim 11, wherein each of the plurality of second voltage regulators comprises: a first slave transistor suitable for regulating a current applied from a power supply based on the first voltage control signal; and a second slave transistor coupled in series to the first slave transistor and suitable for secondarily regulating the current regulated by the first slave transistor based on the second voltage control signal.

20. The controller of claim 19, wherein the second voltage regulator further comprises a driving transistor suitable for controlling operations of the first slave transistor and the second slave transistor.

21. A regulator comprising:

a first voltage regulator suitable for generating a comparison voltage by comparing a reference voltage with a feedback voltage, and outputting a first voltage control signal and a second voltage control signal based on the comparison voltage;

a plurality of second voltage regulators, each having a first slave transistor and a second slave transistor receiving the first voltage control signal and the second voltage control signal, respectively, and wherein each of the plurality of second voltage regulators generates a voltage based on the first voltage control signal and the second voltage control signal, and outputs the generated voltage; and a plurality of control signal transmitters suitable for receiving the first voltage control signal and the second voltage control signal from the first voltage regulator and transferring the received voltage control signals to each of the plurality of second voltage regulators.

22. A controller comprising:

a host interface including:

a receiver circuit suitable for receiving data from a host;

a transmitter circuit suitable for transmitting data to the host; and a regulator suitable for supplying power to the receiver circuit and the transmitter circuit, wherein the regulator comprises:

a first voltage regulator suitable for generating a comparison voltage by comparing a reference voltage with a feedback voltage, and outputting a first voltage control signal and a second voltage control signal based on the comparison voltage;

a plurality of second voltage regulators, each having a first slave transistor and a second slave transistor receiving the first voltage control signal and the second voltage control signal, respectively, and wherein each of the plurality of second voltage regulators generates a voltage based on the first voltage control signal and the second voltage control signal, and outputs the generated voltage; and a control signal transmitter suitable for receiving the first voltage control signal and the second voltage control signal from the first voltage regulator and transferring the received voltage control signals to each of the plurality of second voltage regulators.

* * * * *